(12) United States Patent
Nakahashi

(10) Patent No.: US 8,258,814 B2
(45) Date of Patent: Sep. 4, 2012

(54) CLOCK DISTRIBUTION CIRCUIT AND LAYOUT DESIGN METHOD USING THE SAME

(75) Inventor: Toshiaki Nakahashi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/170,907

(22) Filed: Jun. 28, 2011

(65) Prior Publication Data
US 2011/0258589 A1    Oct. 20, 2011

Related U.S. Application Data

(63) Continuation of application No. 12/778,207, filed on May 12, 2010, now Pat. No. 7,990,179.

(30) Foreign Application Priority Data

Jun. 2, 2009   (JP) .................. 2009-133161

(51) Int. Cl.
H03K 19/096   (2006.01)
H03K 19/094   (2006.01)
G06F 17/50    (2006.01)

(52) U.S. Cl. ............. 326/93; 326/95; 326/112; 327/237

(58) Field of Classification Search .............. 326/93, 326/95, 98, 86, 112, 119, 121, 122; 327/237; 716/5, 114

See application file for complete search history.

(56) References Cited

U.S. PATENT DOCUMENTS 7,191,418 B2   3/2007 Lee et al.
7,571,406 B2 *  8/2009 Johnston .................. 716/114
2007/0033560 A1  2/2007 Johnston

FOREIGN PATENT DOCUMENTS

JP   2002-269166 A   9/2002

* cited by examiner

*Primary Examiner* — Daniel D Chang
(74) *Attorney, Agent, or Firm* — Sughrue Mion, PLLC

(57) ABSTRACT

A layout design method in accordance with an exemplary aspect of the present invention is a layout design method for a clock tree circuit, including disposing a first clock distribution circuit in a clock tree circuit, wiring the clock tree circuit in which the first clock distribution circuit is disposed, verifying timing of the wired clock tree circuit, and replacing the first distribution element by a second clock distribution circuit based on a result of the timing verification, the second clock distribution circuit having roughly a same input load capacitance as the first clock distribution circuit and a different delay value from the first clock distribution circuit.

8 Claims, 14 Drawing Sheets

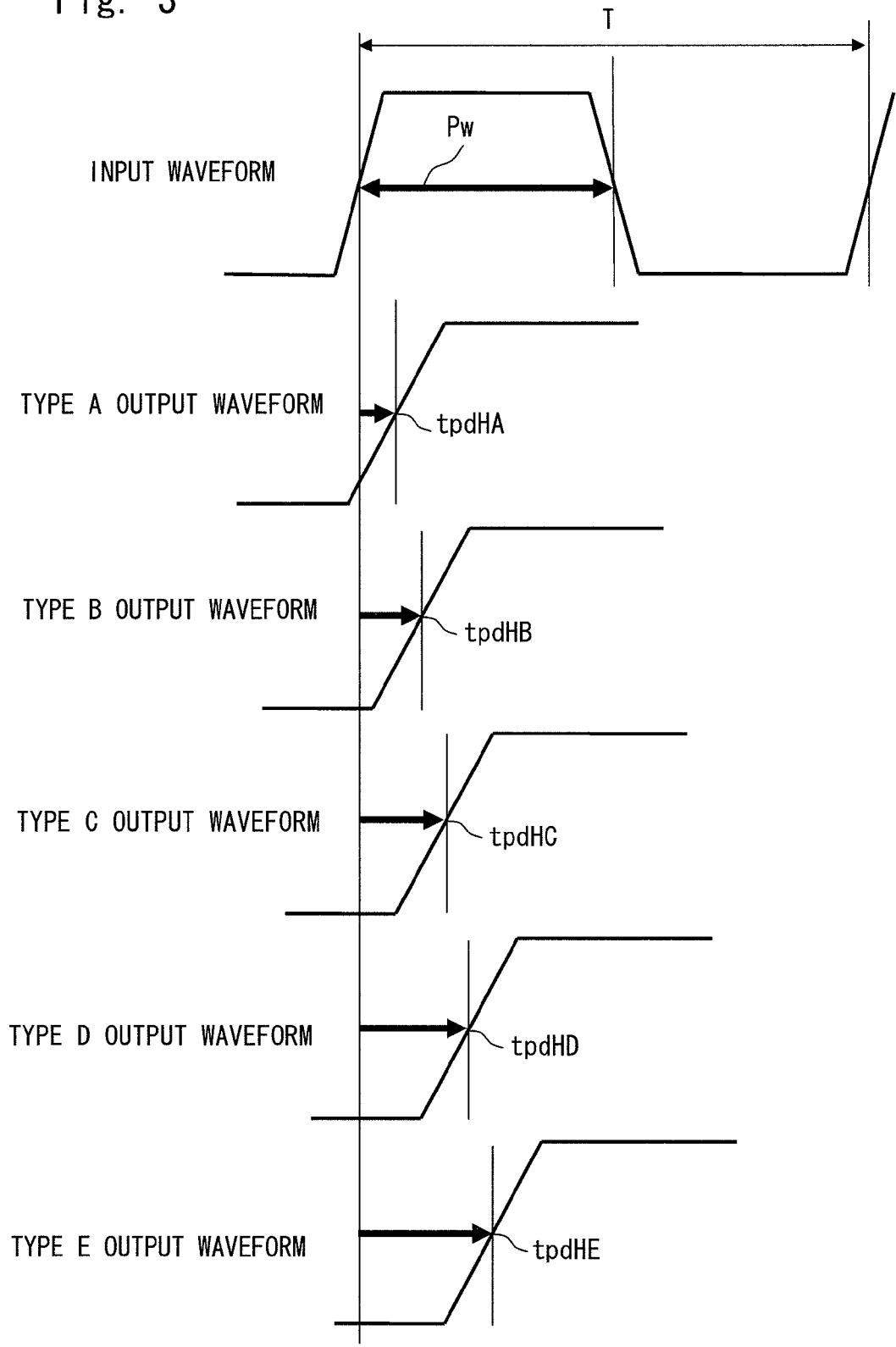

CLOCK DISTRIBUTION CIRCUIT AND LAYOUT DESIGN METHOD USING THE SAME

INCORPORATION BY REFERENCE

This application is a Continuation of application Ser. No. 12/778,207 filed May 12, 2010, which is based upon and claims the benefit of priority from Japanese patent application No. 2009-133161, filed on Jun. 2, 2009, the disclosure of which is incorporated herein in its entirety by reference.

BACKGROUND

1. Field of the Invention

The present invention relates to a clock distribution circuit and a layout design method using the same.

2. Description of Related Art

In LSI (Large Scale Integration) layout design in recent years, as the operating frequency has increased to implement more sophisticated functions, the demand for the increase in accuracy of the signal duty ratio has been grown. In a system in which both rising and falling edges of a clock signal are used, in particular, securing set-up times and hold times of a flip-flop and the like, for example, becomes more difficult as the deviation of the signal duty ratio from 50% becomes larger. Further, in the case of high-frequency signals, the pulse width cannot be secured due to the delay of the rising-edge and falling-edge waveforms. Therefore, it has been desired to adjust the duty ratio of an output signal in such systems.

FIG. 8 shows a clock tree circuit disclosed in FIG. 6 of Japanese Unexamined Patent Application Publication No. 2002-269166. As shown in FIG. 8, the duty ratio of an output signal from a clock tree circuit is adjusted by preparing a plurality of duty ratio adjustment cells 13 having mutually different characteristics, and inserting a proper duty ratio adjustment cell 13 at the first stage of the clock tree circuit in Japanese Unexamined Patent Application Publication No. 2002-269166. Specifically, six types of duty ratio adjustment cells 13 having mutually difference characteristics, for example, are prepared. Then, the duty ratio of a clock tree circuit is adjusted by selecting one of the duty ratio adjustment cells 13 according to a desired duty ratio and inserting the selected duty ratio adjustment cell 13 at the first stage of the clock tree circuit.

FIG. 9 shows a circuit diagram of a duty ratio adjustment cell 13 disclosed in FIG. 7 of Japanese Unexamined Patent Application Publication No. 2002-269166. As shown in FIG. 9, when a duty ratio adjustment cell 13 is driven by two transistors, its switching action becomes faster compared to the case of driving the duty ratio adjustment cell with one transistor. Therefore, it is possible to create a delay difference between the rising edge and the falling edge by cutting off the line C1 or C2.

SUMMARY

However, when the line C1 of the duty ratio adjustment cell 13 shown in FIG. 9 is disconnected to adjust the duty ratio, the input gate capacitance of the P-channel MOS transistor is roughly halved compared to before the disconnection. Therefore, since the input gate capacitance of the input terminal A of the duty ratio adjustment cell 13 decreases, the delay value of the rising edges and the falling edges of a cell at the preceding stage of the duty ratio adjustment cell 13 is changed.

That is, in order to adjust the duty ratio of the output signal from the clock tree circuit of FIG. 8 with high accuracy, it is necessary to take the variation in the delay of the rising and falling edges of the cell at the preceding stage of the duty ratio adjustment cell 13 into consideration. Therefore, it poses a problem that adjusting the duty ratio is very difficult.

A first exemplary aspect of the present invention is a layout design method for a clock tree circuit, including: disposing a first clock distribution circuit in a clock tree circuit; wiring the clock tree circuit in which the first clock distribution circuit is disposed; verifying timing of the wired clock tree circuit; and replacing the first distribution element by a second clock distribution circuit based on a result of the timing verification, the second clock distribution circuit having roughly a same input load capacitance as the first clock distribution circuit and a different delay value from the first clock distribution circuit.

Another exemplary aspect of the present invention is a clock distribution circuit including a first inverter circuit, the first inverter circuit including: serially-connected N transistors having a first conductive type (N is a natural number equal to or greater than 2); and M transistors having a second conductive type (M is a natural number equal to or greater than 1), the M transistors being connected in series with the N transistors having the first conductive type, wherein a delay value is adjusted by a combination of a pair of a transistor having the first conductive type and a transistor having the second conductive type of which an input signal is input to a control terminal.

Since the input load capacitances are roughly equal to each other among a plurality of clock distribution circuits having different delay values, the duty ratio can be easily adjusted with high accuracy.

In accordance with an exemplary aspect, the present invention can provide a clock distribution circuit and a layout design method capable of easily adjusting a duty ratio with high accuracy.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a timing chart of a duty adjustment block in accordance with a first exemplary embodiment of the present invention;

DETAILED DESCRIPTION OF THE EXEMPLARY EMBODIMENTS

Specific exemplary embodiments to which the present invention is applied are explained hereinafter in detail with reference to the drawings. However, the present invention is not limited to the exemplary embodiments shown below. Further, for clarifying the explanation, the following descriptions and the figures are simplified as appropriate.

First Exemplary Embodiment

Figure 1:
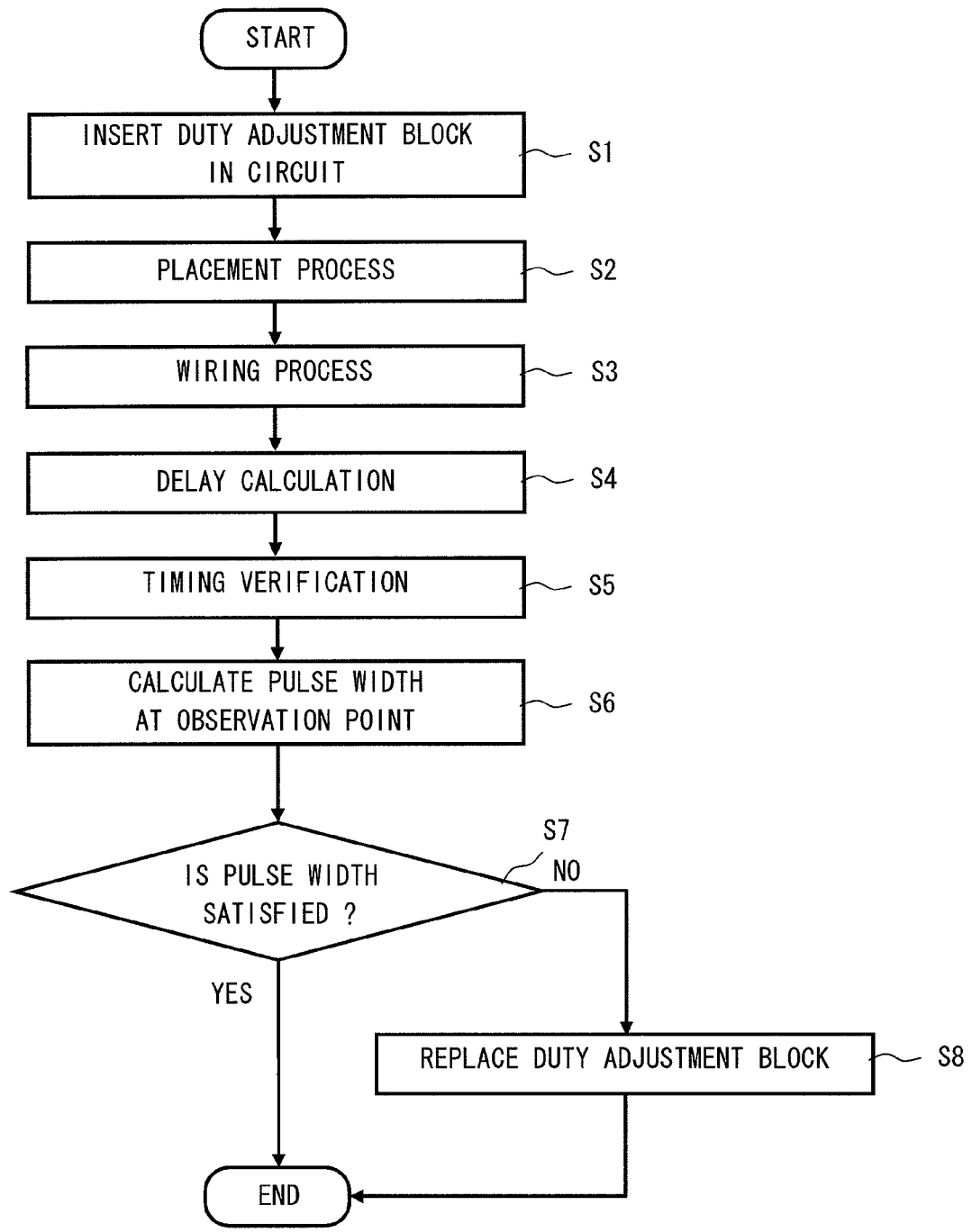
FIG. 1 is a flowchart of layout design in accordance with a first exemplary embodiment of the present invention.

FIG. 1 is a flowchart of layout design in accordance with a first exemplary embodiment of the present invention. Firstly, in a clock tree circuit, a duty adjustment block having a middle value in terms of delay characteristic, among a plurality of types of prepared duty adjustment blocks, is inserted on a critical path including a block requiring a highly-accurate duty ratio (step S1). Note that the details of the above-mentioned plurality of types of prepared duty adjustment blocks are explained later with reference to FIGS. 2A to 2E.

Next, a placement process is performed on the clock tree circuit in which the duty adjustment block was inserted in the step S1 (step S2). Next, a wiring process is performed on a clock tree circuit in which the duty adjustment block was disposed (step S3). Then, the delay of the critical path is calculated from the resultant clock tree circuit on which the placement and wiring processes were performed (step S4). Next, timing verification of the critical path is carried out based on the delay calculation (step S5). Next, a pulse width is calculated by using the input terminal of the block inserted in the step S1 as an observation point (step S6).

Next, it is determined whether the pulse width satisfies a required value or not (step S7). If it is satisfied (Yes in step S7), the process is terminated. On the other hand, if it is not satisfied (No in step S7), another duty adjustment block that is suited for the amount of the difference from the required pulse width is selected from among the plurality of types of prepared duty adjustment blocks, and is substituted for the current duty adjustment block (step S8). Note that when there are two or more critical paths that require a duty-ratio adjustment, they are dealt with by repeating the steps S1, S6, S7 and S8 as many times.

Figure 2A:
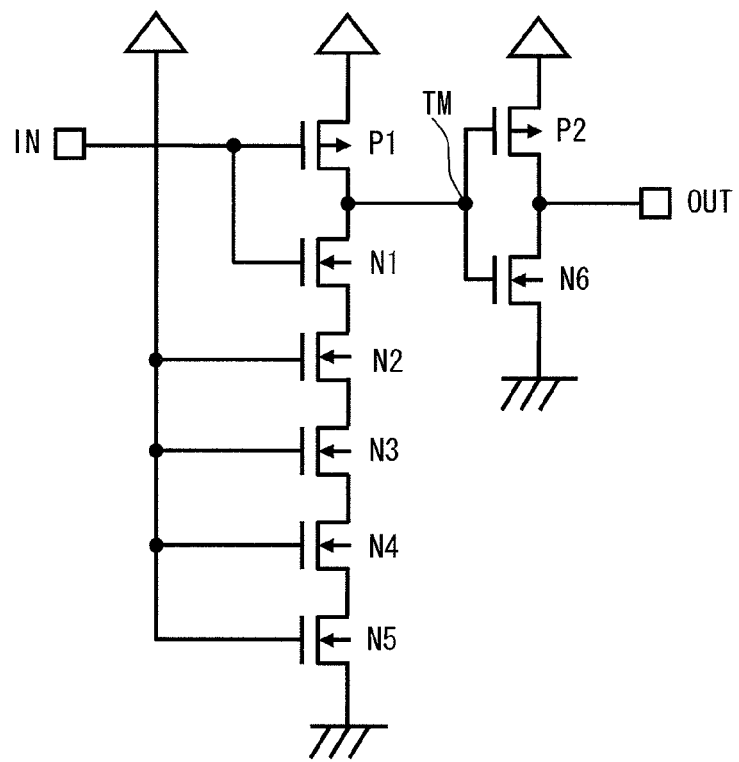
FIG. 2A is a circuit diagram of a duty adjustment block (type A) in accordance with a first exemplary embodiment of the present invention.

FIGS. 2A to 2E are circuit diagrams of duty adjustment blocks in accordance with a first exemplary embodiment of the present invention. Each of the duty adjustment blocks of FIGS. 2A to 2E is a clock distribution buffer, and an example of a clock distribution circuit. A duty adjustment block of FIG. 2A is a buffer circuit composed of a first inverter at the front stage and a second inverter at the rear stage. The input of the first inverter is the input terminal IN, and its output is the intermediate node TM. Further, the input of the second inverter is the intermediate node TN, and its output is the output terminal OUT. Hereinafter, this block is called "type A".

The first inverter is composed of a P-channel MOS transistor P1 and N-channel MOS transistors N1 to N5. The input terminal IN is connected to the gates of the P-channel MOS transistor P1 and the N-channel MOS transistor N1. The gates of the N-channel MOS transistors N2 to N5, which are not connected to the input terminal IN, are connected to a power supply Vdd. Therefore, the N-channel MOS transistors N2 to N5 are in an On-state at all the states.

The source of the P-channel MOS transistor P1 is connected to the power supply Vdd, and the drain is connected to the drain of the N-channel MOS transistor N1. The node between the drains of the P-channel MOS transistor P1 and the N-channel MOS transistor N1 serves as the output node of the first inverter, i.e., as the intermediate node TM.

The N-channel MOS transistors N1 to N5 are connected in series. Specifically, the source of the N-channel MOS transistor N1 is connected to the drain of the N-channel MOS transistor N2. The source of the N-channel MOS transistor N2 is connected to the drain of the N-channel MOS transistor N3. The source of the N-channel MOS transistor N3 is connected to the drain of the N-channel MOS transistor N4. The source of the N-channel MOS transistor N4 is connected to the drain of the N-channel MOS transistor N5. Finally, the source of the N-channel MOS transistor N5 is connected to a ground GND.

The second inverter is composed of a P-channel MOS transistor P2 and an N-channel MOS transistor N6. The intermediate node TM is connected to the gates of the P-channel MOS transistor P2 and the N-channel MOS transistor N6. The source of the P-channel MOS transistor P2 is connected to the power supply Vdd and the drain is connected to the N-channel MOS transistor N6. The node between the drains of the P-channel MOS transistor P2 and the N-channel MOS transistor N6 serves as the output node of the second inverter and is connected to the output terminal OUT. The source of the N-channel MOS transistor N6 is connected to the ground GND.

In the type A, the number of N-channel MOS transistors between the drain of the activated N-channel MOS transistor N1 and the intermediate node TM is zero.

Figure 2B:
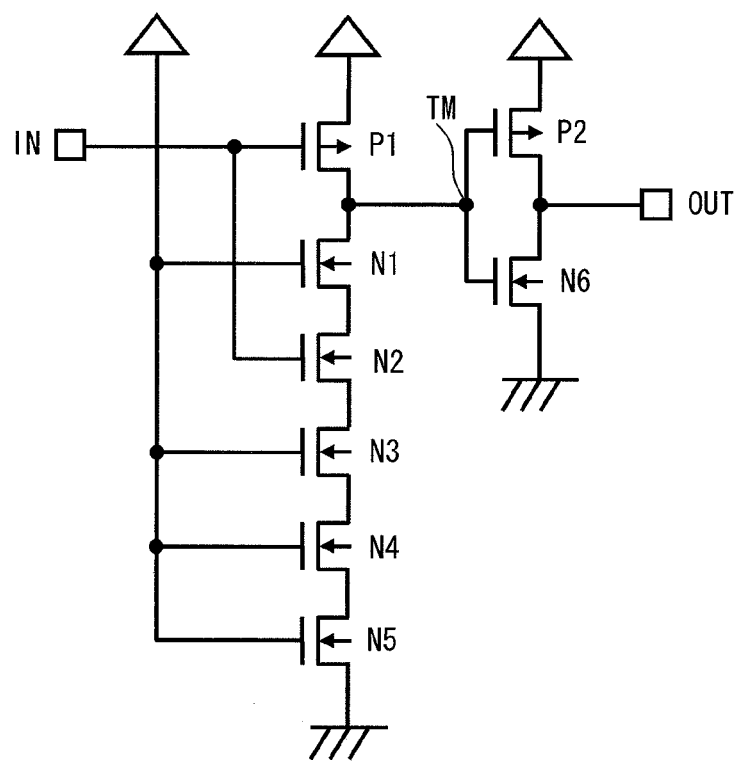
FIG. 2B is a circuit diagram of a duty adjustment block (type B) in accordance with a first exemplary embodiment of the present invention.

Next, in the duty adjustment block of FIG. 2B, the input terminal IN is connected to the gate of the N-channel MOS transistor N2 and the N-channel MOS transistor N2 is thereby activated. The gate of the N-channel MOS transistor N1 is connected to the power supply Vdd, and the N-channel MOS transistor N1 thereby functions as a serially-connected resistive element. Hereinafter, this block is called "type B". The other configuration is similar to that of the type A.

Figure 2C:
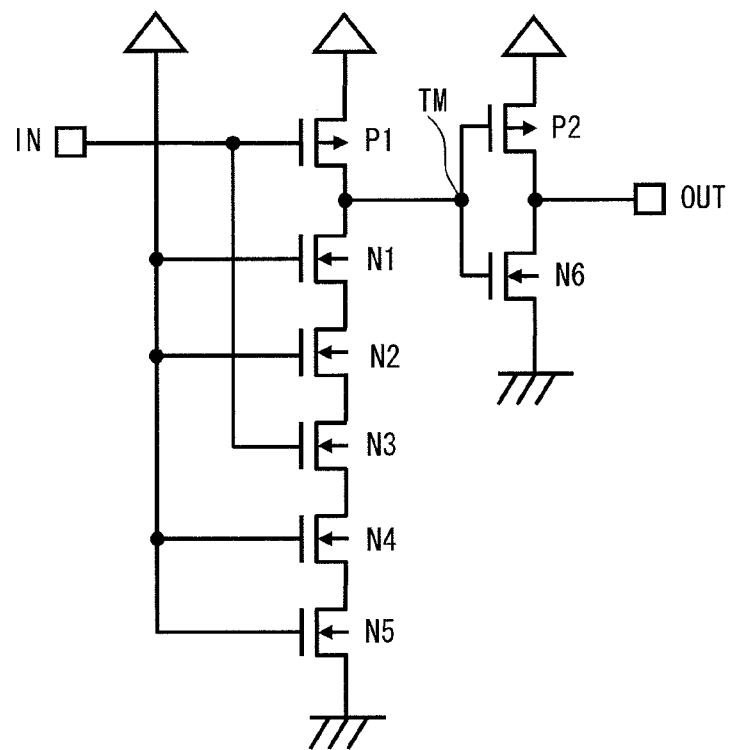
FIG. 2C is a circuit diagram of a duty adjustment block (type C) in accordance with a first exemplary embodiment of the present invention.

Next, in the duty adjustment block of FIG. 2C, the input terminal IN is connected to the gate of the N-channel MOS transistor N3 and the N-channel MOS transistor N3 is thereby activated. Two N-channel MOS transistors N1 and N2 function as serially-connected resistive elements. Hereinafter, this block is called "type C". The other configuration is similar to that of the type A.

Figure 2D:
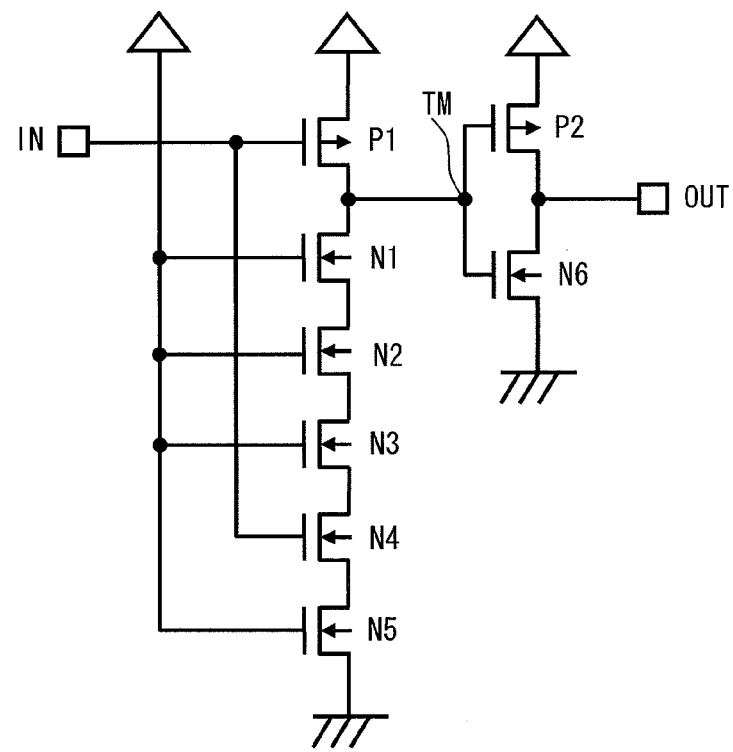
FIG. 2D is a circuit diagram of a duty adjustment block (type D) in accordance with a first exemplary embodiment of the present invention.

Next, in the duty adjustment block of FIG. 2D, the input terminal IN is connected to the gate of the N-channel MOS transistor N4 and the N-channel MOS transistor N4 is thereby activated. Three N-channel MOS transistors N1 to N3 function as serially-connected resistive elements. Hereinafter, this block is called "type D". The other configuration is similar to that of the type A.

Figure 2E:
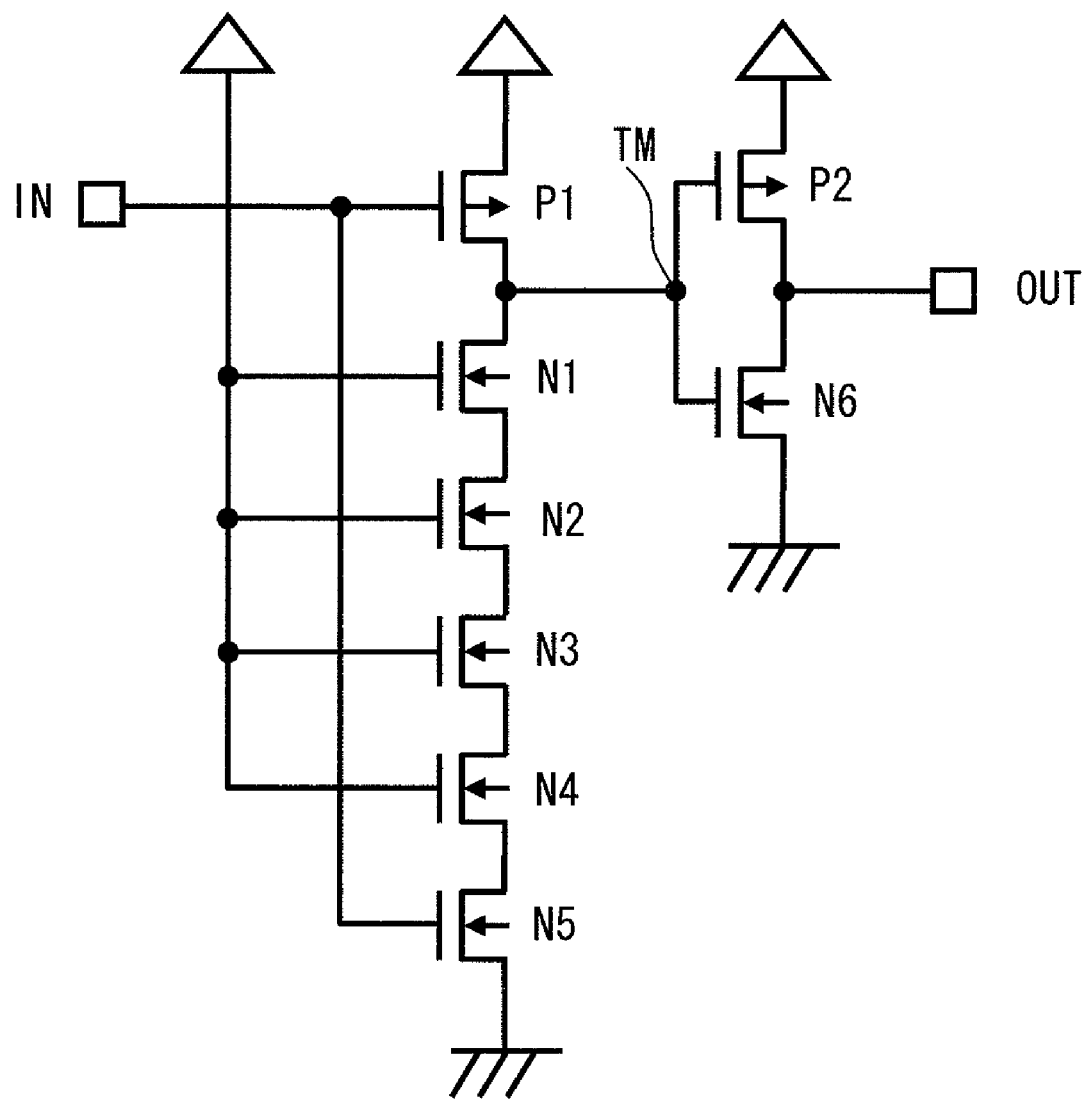
FIG. 2E is a circuit diagram of a duty adjustment block (type E) in accordance with a first exemplary embodiment of the present invention.

Next, in the duty adjustment block of FIG. 2E, the input terminal IN is connected to the gate of the N-channel MOS transistor N5 and the N-channel MOS transistor N5 is thereby activated. Four N-channel MOS transistors N1 to N4 function as serially-connected resistive elements. Hereinafter, this block is called "type E". The other configuration is similar to that of the type A.

As explained above for the types A to E, the number of an N-channel MOS transistor(s) connected between the drain of the activated N-channel MOS transistor and the intermediate node TM, i.e., a serially-connected resistive element(s) connected between the drain of the activated N-channel MOS transistor and the intermediate node TM is changed from zero to four in the first inverter. By using a duty adjustment block like this, it is possible to generate five different rising delays.

Note that the sizes of the P-channel MOS transistor P1 and the N-channel MOS transistors N1 to N5, which constitute the first inverter, are determined so that the rising time and falling time become equal to each other in the case of the type C. It is preferable to insert the type C duty adjustment block initially in the step S1 of FIG. 1. By doing so, the delay adjustment amount can be adjusted both to the positive side and the negative side to the same extent.

FIG. 3 shows timing charts of duty adjustment blocks shown in FIGS. 2A to 2E. The input waveform is a waveform having a period T, a pulse width Pw, and a duty ratio of (Pw/T×100) percent.

The output waveform of the type A is a waveform at the output terminal OUT that is formed when the input waveform is input to the input terminal IN of the type A block. The rising delay is tpdHA. The output waveform of the type B is a waveform at the output terminal OUT that is formed when the input waveform is input to the input terminal IN of the type B block. The rising delay is tpdHB. The output waveform of the type C is a waveform at the output terminal OUT that is formed when the input waveform is input to the input terminal IN of the type C block. The rising delay is tpdHC. The output waveform of the type D is a waveform at the output terminal OUT that is formed when the input waveform is input to the input terminal IN of the type D block. The rising delay is tpdHD. The output waveform of the type E is a waveform at the output terminal OUT that is formed when the input waveform is input to the input terminal IN of the type E block. The rising delay is tpdHE.

As shown in FIG. 3, the rising delays have a relation expressed as "tpdHA<tpdHB<tpdHC<tpdHD<tpdHE". That is, each rising delay exhibits a different characteristic from the other rising delays among the types A to E. On the other hand, the falling delays (not shown) exhibit the same characteristic among the types A to E.

Figure 4A:
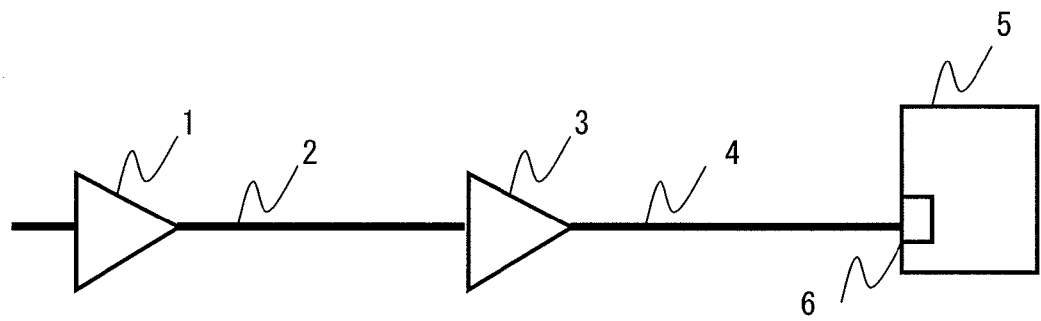
FIG. 4A is a circuit diagram of a clock tree circuit to which a duty adjusting method in accordance with a first exemplary embodiment of the present invention is applied.
Figure 4B:
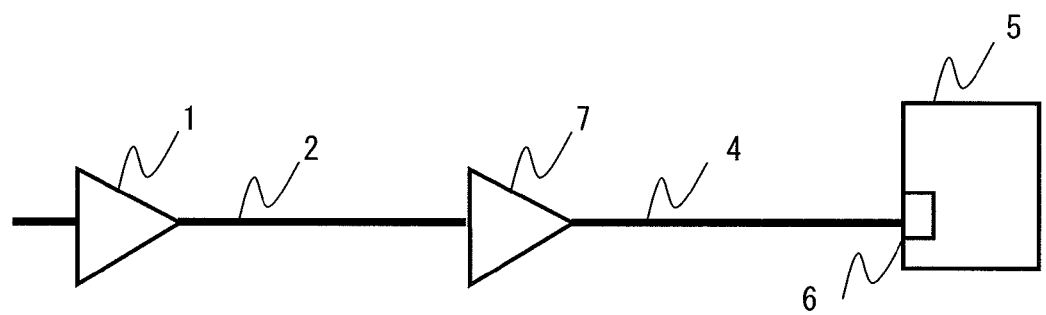
FIG. 4B is a circuit diagram of a clock tree circuit to which a duty adjusting method in accordance with a first exemplary embodiment of the present invention is applied.
Figure 5A:
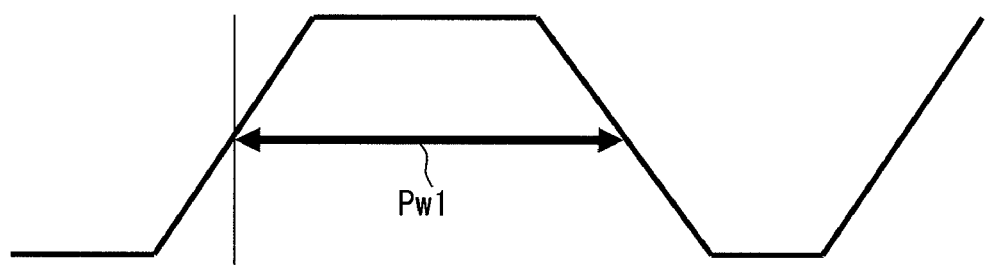
FIG. 5A is a timing waveform observed at a terminal 6 of a block 5 shown in FIG. 4A.
Figure 5B:
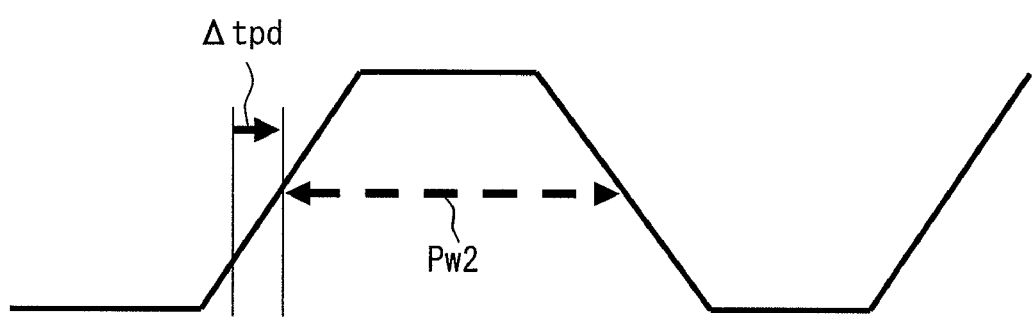
FIG. 5B is a timing waveform observed at a terminal 6 of a block 5 shown in FIG. 4B.

FIGS. 4A and 4B are circuit diagrams of blocks including a critical path requiring a highly-accurate duty ratio in a clock tree circuit. FIGS. 5A and 5B are timing charts for explaining operations of the circuits shown in FIGS. 4A and 4B.

FIG. 4A shows a critical path in which a duty adjustment block 3 of the type C is inserted between the output of a block 1 and an input terminal 6 of a block 5 requiring a highly-accurate duty ratio. The block 1 and the duty adjustment block 3 are connected through a line 2 of the block 1. Further, the duty adjustment block 3 and the input terminal 6 of the block 5 are connected through a line 4 of the duty adjustment block 3.

FIG. 5A shows a timing waveform observed at the terminal 6 of the block 5 shown in FIG. 4A. The sign "Pw1" represents a pulse width. Assuming that the pulse width required at the terminal 6 of the block 5 is Pw2 shown in FIG. 5B, the difference in pulse width between the required pulse width Pw2 and the observed pulse width Pw1 is a delay Δtpd.

Therefore, a duty adjustment block having a characteristic different from that of the duty adjustment block 3 of FIG. 4A by Δtpd is selected from the prepared duty adjustment blocks. For example, the duty adjustment block 3 of the type C of FIG. 4A is replaced by the duty adjustment block 7 of the type E as shown in FIG. 4B.

FIG. 5B shows a timing waveform observed at the terminal 6 of the block 5 shown in FIG. 4B. The duty adjustment block 7 of the type E has such a characteristic that its rising timing is different from that of the duty adjustment block 3 of the type C by Δtpd. Therefore, the pulse width Pw2 shown in FIG. 5B is obtained instead of the pulse width Pw1, and therefore a desired duty ratio can be realized.

In this exemplary embodiment of the present invention, the placement and wiring is performed on a clock tree circuit in which a certain duty adjustment block is inserted in advance, and then the adjustment of the duty ratio is implemented just by replacing the duty adjustment block. Therefore, if the duty adjustment block of one of the types A to E is replaced by a duty adjustment block of another one of the types A to E, the wiring lines 2 and 4 connecting the duty adjustment block with the preceding block 1 and the subsequent block 5, respectively, as well as the input capacitance of the duty adjustment block itself are unchanged. That is, the delay of the block 1 and the delays of the lines 2 and 4 are unchanged. Therefore, by replacing the duty adjustment block 3 with the duty adjustment block 7, only the difference in the duty adjustment blocks themselves is reflected on the pulse width at the observation point. Accordingly, the duty ratio can be easily adjusted with high accuracy.

Second Exemplary Embodiment

Next, a second exemplary embodiment of the present invention is explained with reference to FIGS. 6A to 6E. FIGS. 6A to 6E are circuit diagrams of duty adjustment blocks in accordance with a second exemplary embodiment. Each of duty adjustment blocks shown in FIGS. 6A to 6E is a clock distribution buffer, and an example of a clock distribution circuit. Each of the duty adjustment blocks of FIGS. 6A to 6E has additional four P-channel MOS transistors in the first inverter in comparison to the respective one of the duty adjustment blocks of FIGS. 2A to 2E. That is, each of them is a duty adjustment block in which five P-channel MOS transistors and five N-channel MOS transistors are connected in a cascade configuration.

The number of an N-channel MOS transistor(s) connected between the drain of the activated N-channel MOS transistor and the intermediate node TM, i.e., a serially-connected resistive element(s) connected between the drain of the activated N-channel MOS transistor and the intermediate node TM can be changed from zero to four. Further, the number of a P-channel MOS transistor(s) connected between the drain of the activated P-channel MOS transistor and the intermediate node TM, i.e., a serially-connected resistive element(s) connected between the drain of the activated P-channel MOS transistor and the intermediate node TM can be also changed from zero to four. Therefore, the rising delay can be adjusted in five levels on the N-channel side, and the falling delay can be also adjusted in five levels on the P-channel side. That is, the delay can be adjusted in 5×5=25 levels. Therefore, the duty ratio can be adjusted in a wider range and in a finer step compared to the first exemplary embodiment.

Figure 6A:
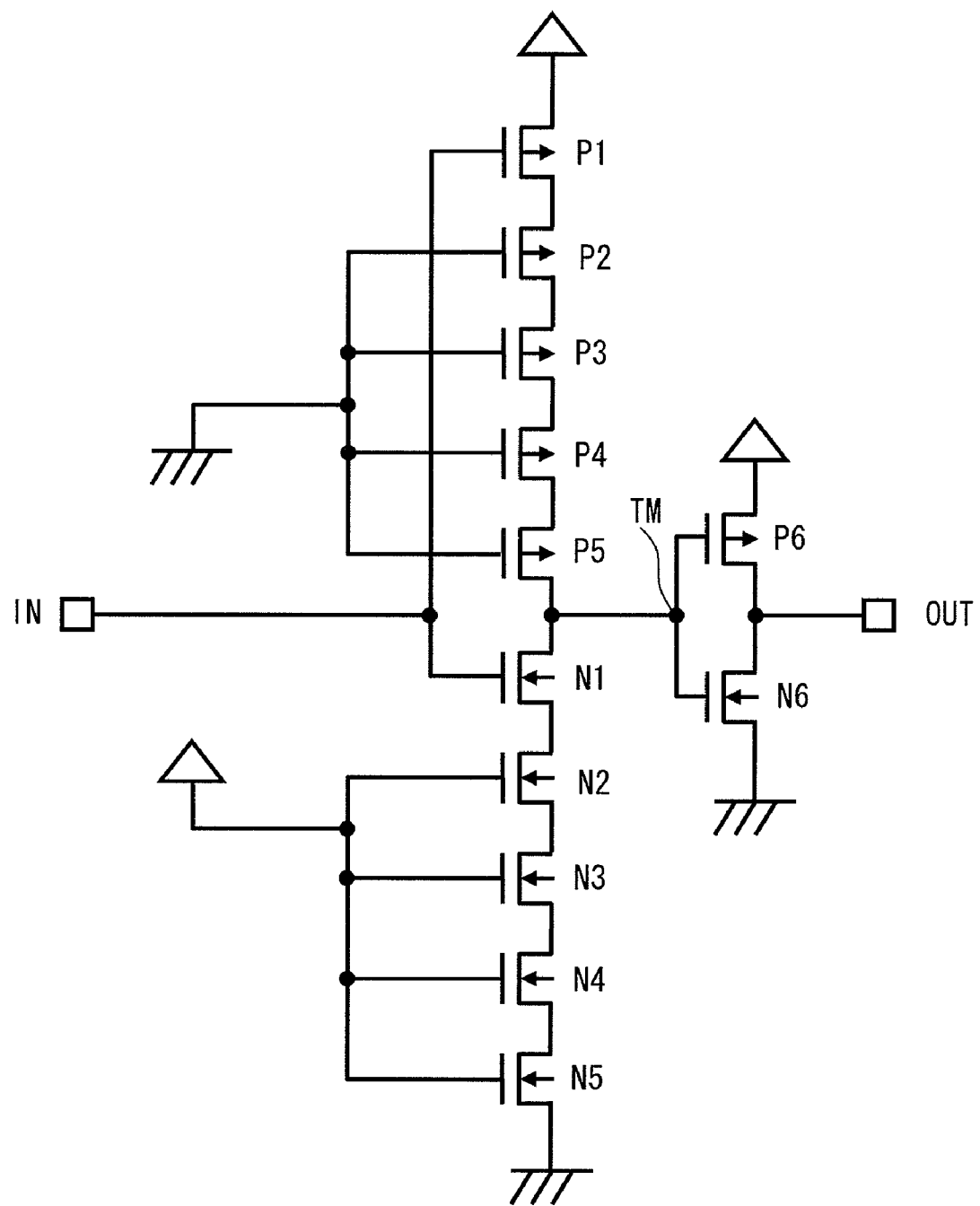
FIG. 6A is a circuit diagram of a duty adjustment block (type A) in accordance with a second exemplary embodiment of the present invention.

In the duty adjustment block shown in FIG. 6A, the input terminal IN is connected to the gates of the N-channel MOS transistor N1 and the P-channel MOS transistor P1, and the P-channel MOS transistor P1 and the N-channel MOS transistor N1 are thereby activated. The number of N-channel MOS transistors that function as a serially-connected resistive element(s) is zero, and the number of P-channel MOS transistors that function as a serially-connected resistive element(s) is four. Hereinafter this block is called "type A2".

Figure 6B:
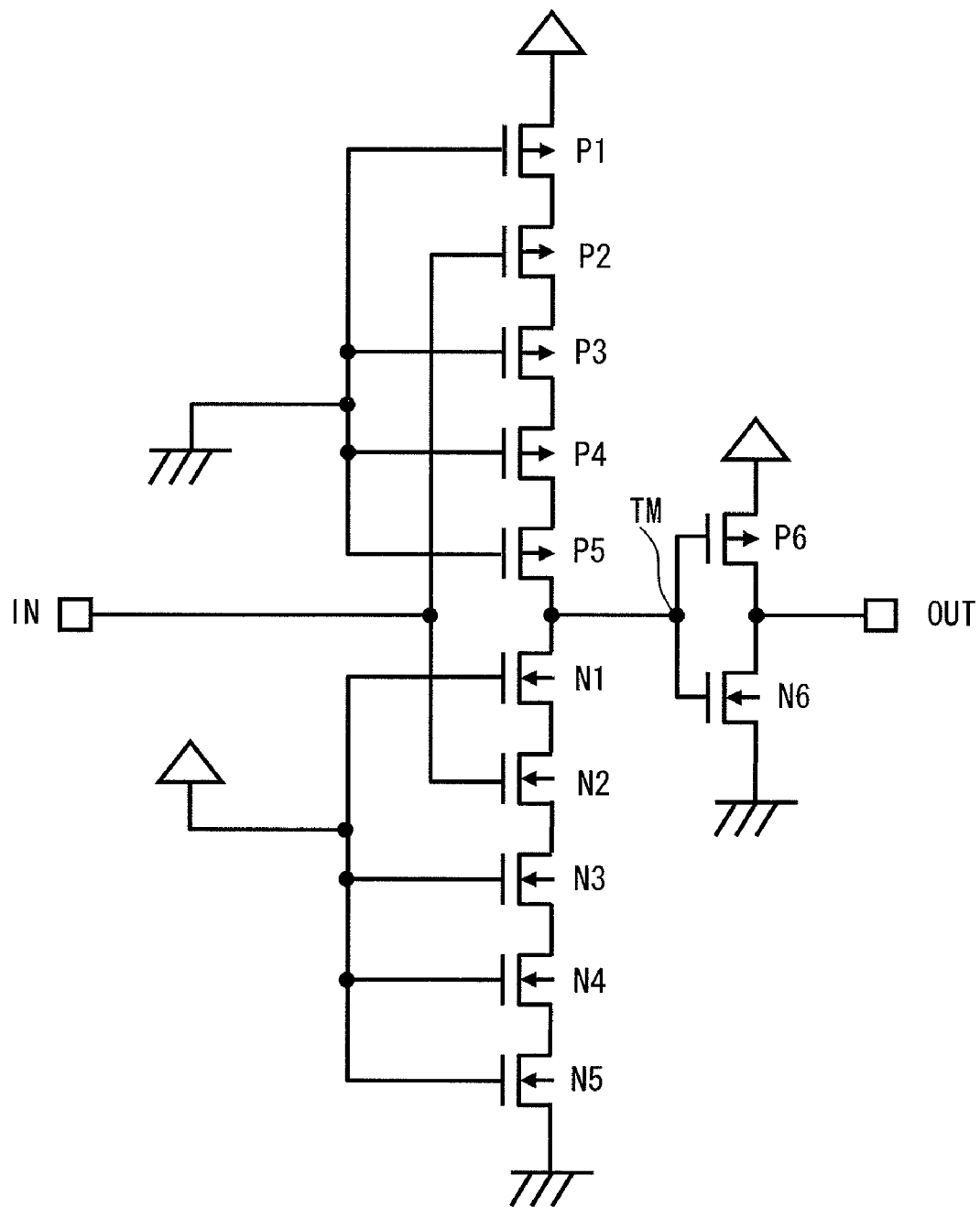
FIG. 6B is a circuit diagram of a duty adjustment block (type B) in accordance with a second exemplary embodiment of the present invention.

In the duty adjustment block shown in FIG. 6B, the input terminal IN is connected to the gates of the N-channel MOS transistor N2 and the P-channel MOS transistor P2, and the P-channel MOS transistor P2 and the N-channel MOS transistor N2 are thereby activated. The number of N-channel MOS transistors that function as a serially-connected resistive element(s) is one, and the number of P-channel MOS transistors that function as a serially-connected resistive element(s) is three. Hereinafter this block is called "type B2".

Figure 6C:
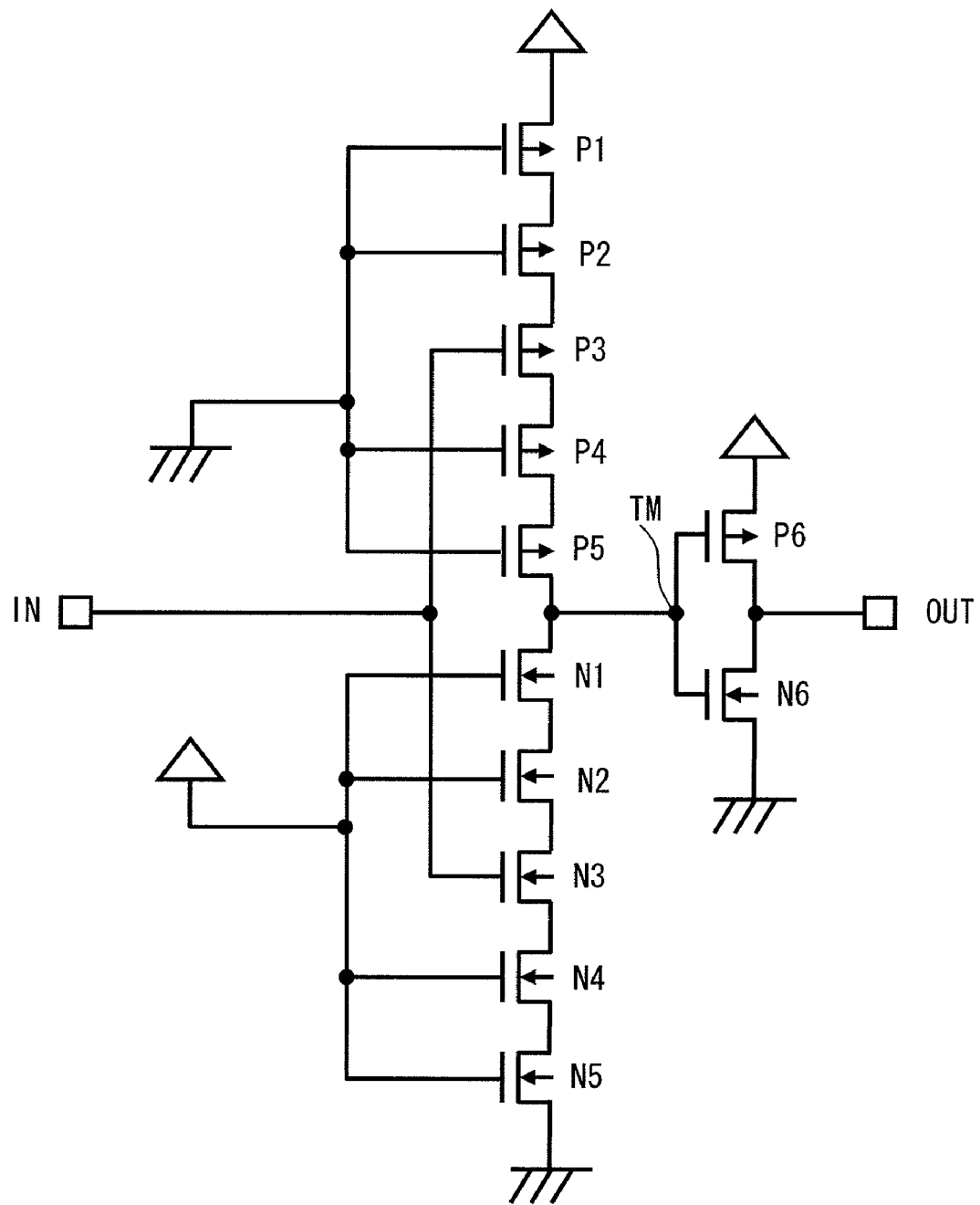
FIG. 6C is a circuit diagram of a duty adjustment block (type C) in accordance with a second exemplary embodiment of the present invention.

In the duty adjustment block shown in FIG. 6C, the input terminal IN is connected to the gates of the N-channel MOS transistor N3 and the P-channel MOS transistor P3, and the P-channel MOS transistor P3 and the N-channel MOS transistor N3 are thereby activated. The number of N-channel MOS transistors that function as a serially-connected resistive element(s) is two, and the number of P-channel MOS transistors that function as a serially-connected resistive element(s) is two. Hereinafter this block is called "type C2".

Figure 6D:
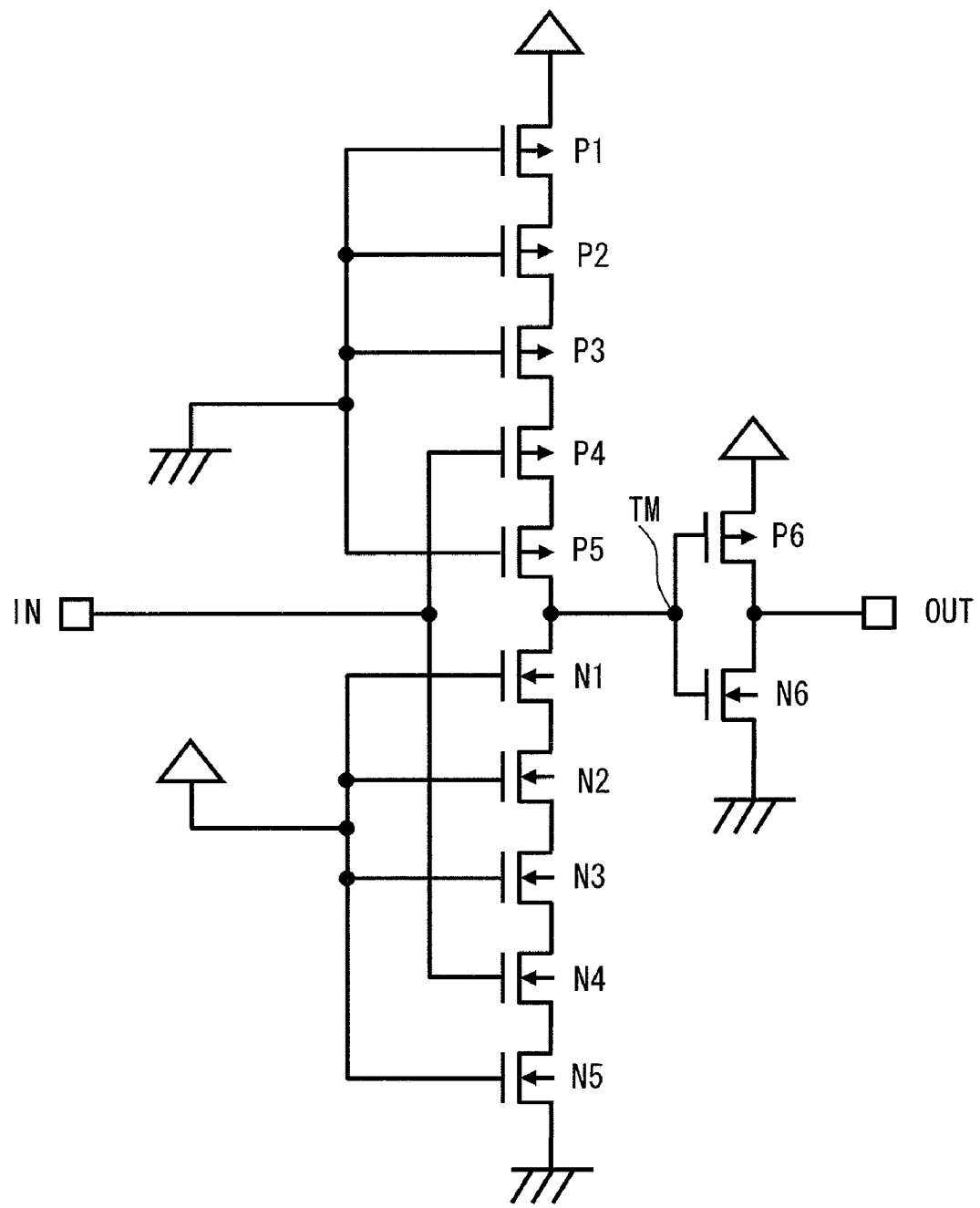
FIG. 6D is a circuit diagram of a duty adjustment block (type D) in accordance with a second exemplary embodiment of the present invention.

In the duty adjustment block shown in FIG. 6D, the input terminal IN is connected to the gates of the N-channel MOS transistor N4 and the P-channel MOS transistor P4, and the P-channel MOS transistor P4 and the N-channel MOS transistor N4 are thereby activated. The number of N-channel MOS transistors that function as a serially-connected resistive element(s) is three, and the number of P-channel MOS transistors that function as a serially-connected resistive element(s) is one. Hereinafter this block is called "type D2".

Figure 6E:
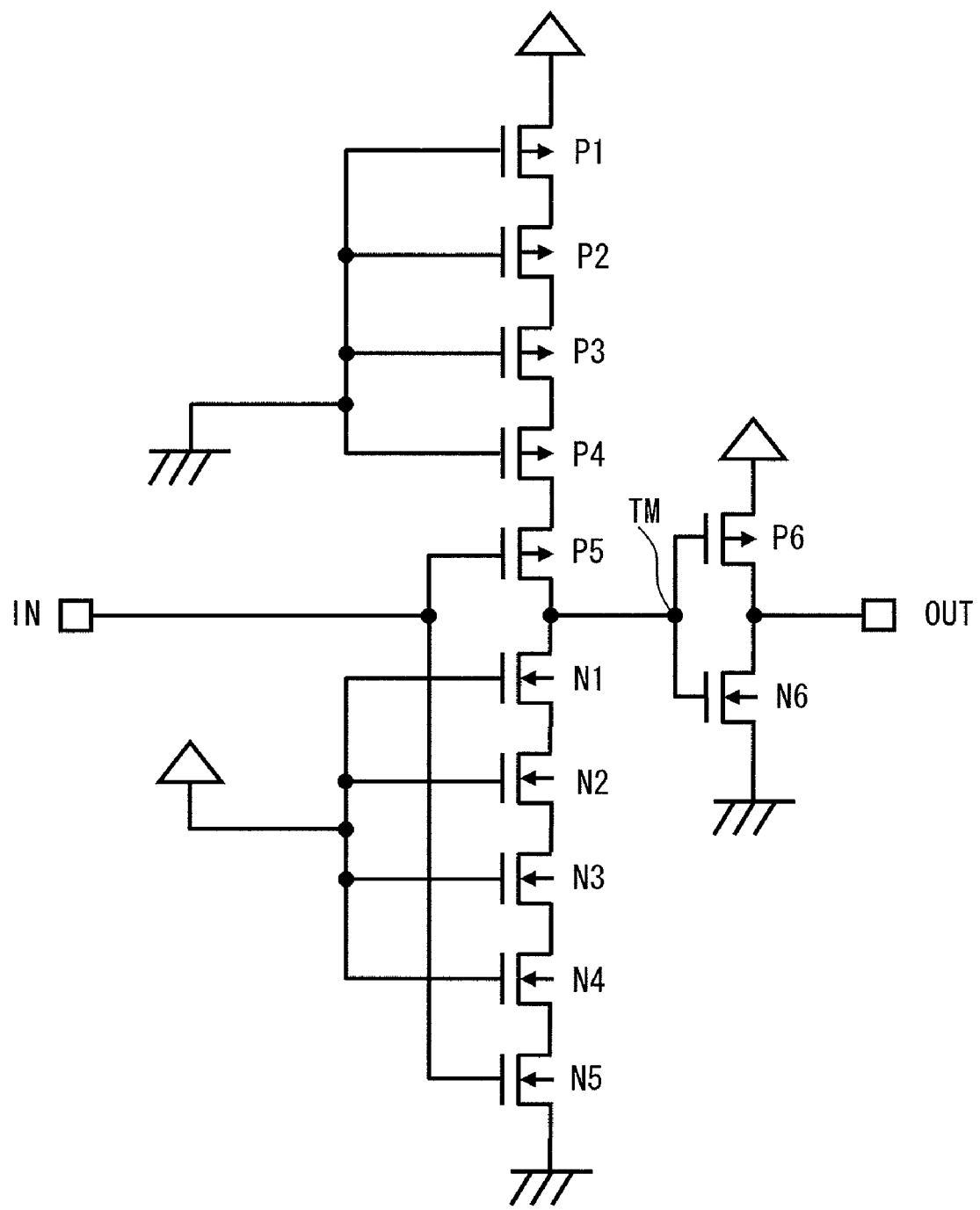
FIG. 6E is a circuit diagram of a duty adjustment block (type E) in accordance with a second exemplary embodiment of the present invention.

In the duty adjustment block shown in FIG. 6E, the input terminal IN is connected to the gates of the N-channel MOS transistor N5 and the P-channel MOS transistor P5, and the P-channel MOS transistor P5 and the N-channel MOS transistor N5 are thereby activated. The number of N-channel MOS transistors that function as a serially-connected resistive element(s) is four, and the number of P-channel MOS transistors that function as a serially-connected resistive element(s) is zero. Hereinafter this block is called "type E2".

Figure 7:
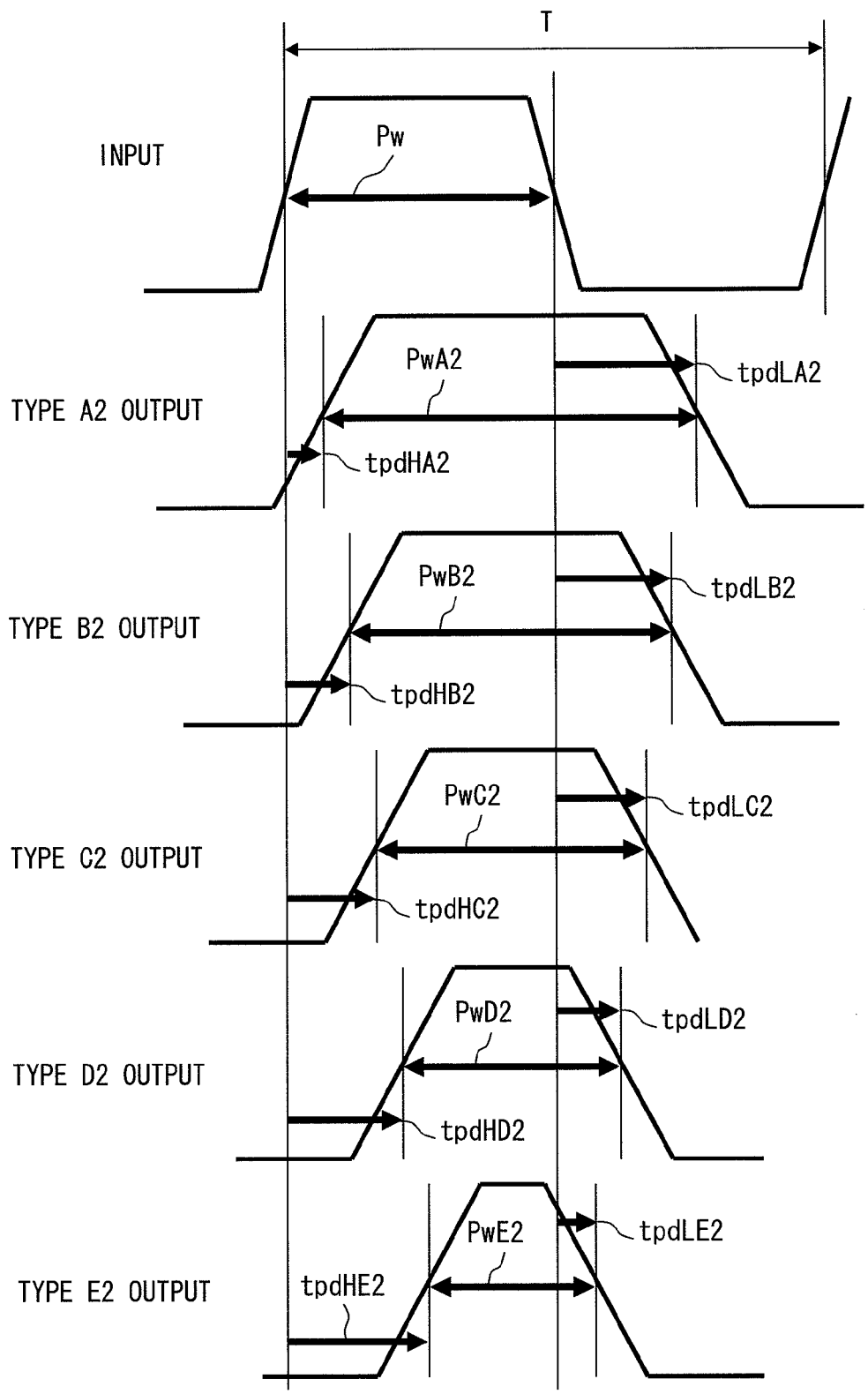
FIG. 7 is a timing chart of duty adjustment blocks in accordance with a second exemplary embodiment of the present invention.
Figure 8:
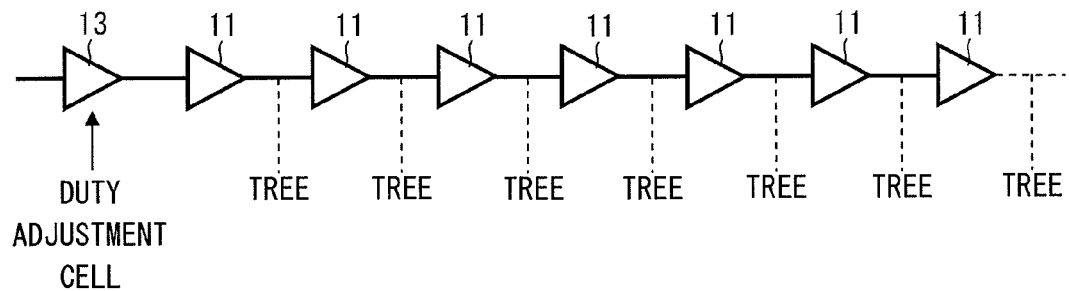
FIG. 8 shows a clock tree circuit disclosed in FIG. 6 of Japanese Unexamined Patent Application Publication No. 2002-269166.
Figure 9:
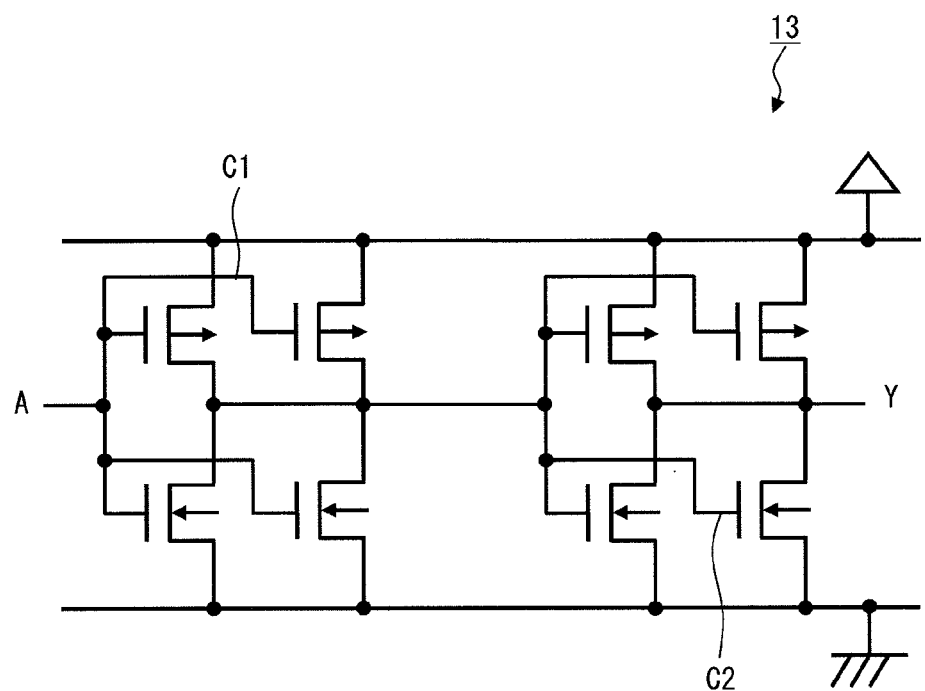
FIG. 9 shows a circuit diagram of a duty ratio adjustment cell disclosed in FIG. 7 of Japanese Unexamined Patent Application Publication No. 2002-269166.

FIG. 7 is a timing chart of duty adjustment blocks shown in FIGS. 6A to 6E. The input waveform is a waveform having a period T, a pulse width Pw, and a duty ratio of (Pw/T×100) percent.

The output of the type A2 is a waveform at the output terminal OUT of the type A2 that is formed when the input waveform is input to the input terminal IN of the type A2 block. The rising delay is tpdHA2, and the falling delay is tpdLA2. The output of the type B2 is a waveform at the output terminal OUT of the type B2 that is formed when the input waveform is input to the input terminal IN of the type B2 block. The rising delay is tpdHB2, and the falling delay is tpdLB2. The output of the type C2 is a waveform at the output terminal OUT of the type C2 that is formed when the input waveform is input to the input terminal IN of the type C2 block. The rising delay is tpdHC2, and the falling delay is tpdLC2. The output of the type D2 is a waveform at the output terminal OUT of the type D2 that is formed when the input waveform is input to the input terminal IN of the type D2 block. The rising delay is tpdHD2, and the falling delay is tpdLD2. The output of the type D2 is a waveform at the output terminal OUT of the type D2 that is formed when the input waveform is input to the input terminal IN of the type D2 block. The rising delay is tpdHE2, and the falling delay is tpdLE2.

As shown in FIG. 7, the rising delays have a relation expressed as "tpdHA2<tpdHB2<tpdHC2<tpdHD2<tpdHE2". Meanwhile, the falling delays have a relation expressed as "tpdLA2>tpdLB2>tpdLC2>tpdLD2>tpdLE2".

In the following explanation, assume that the pulse width of a High level of the input waveform is Pw. The pulse width PwA2 of a High level of the type A2 output can be expressed as "PwA2=Pw−tpdHA2+tpdLA2". The pulse width PwB2 of a High level of the type B2 output can be expressed as "PwB2=Pw−tpdHB2+tpdLB2". The pulse width PwC2 of a High level of the type C2 output can be expressed as "PwC2=Pw−tpdHC2+tpdLC2". The pulse width PwD2 of a High level of the type D2 output can be expressed as "PwD2=Pw−tpdHD2+tpdLD2". The pulse width PwE2 of a High level of the type E2 output can be expressed as "PwE2=Pw−tpdHE2+tpdLE2". Note that a formula "PwA2>PwB2>PwC2>PwD2>PwE2" is satisfied.

By using the type C2 block, which has substantially a middle value in terms of pulse width among these five types of duty adjustment blocks, as an initial duty adjustment block, designing is performed in accordance with the flow shown in FIG. 1.

Note that five types of the duty adjustment blocks shown in FIGS. 6A to 6E are explained so far. As described previously, each of the number of N-channel MOS transistors connected between the drain of the activated N-channel MOS transistor and the intermediate node TM and the number of P-channel MOS transistors connected between the drain of the activated P-channel MOS transistor and the intermediate node TM can be changed from zero to four. Therefore, 5×5=25 types of duty adjustment blocks may be prepared.

As has been explained above, one transistor is selected as an activated transistor from p number of P-channel MOS transistors, and one transistor is also selected as an activated transistor from n number of N-channel MOS transistors. Further, the gates of the remaining transistors are clamped so that they become serially-connected resistive elements formed from MOS transistors. By changing the combination of the number of serially-connected resistive elements composed of P-channel MOS transistors connected to the drain of the activated P-channel MOS transistor and the number of serially-connected resistive elements composed of N-channel MOS transistors connected to the drain of the activated N-channel MOS transistor, both the rising delay and the falling delay can be changed. Specifically, replacement can be made among semiconductor integrated circuits (duty adjustment blocks) having the same input capacitance and p×n different pulse widths without affecting the delay of a block at the preceding stage. Therefore, the duty ratio can be easily adjusted with high accuracy.

Further, since semiconductor integrated circuits (duty adjustment blocks) used to adjust a pulse width have the same size, the adjustment can be made just by replacing the duty adjustment block. That is, the duty adjustment does not require any layout modification.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A layout design method for a clock tree circuit, comprising:
    disposing a first clock distribution circuit in a clock tree circuit;
    wiring the clock tree circuit in which the first clock distribution circuit is disposed;
    verifying timing of the wired clock tree circuit; and
    replacing the first clock distribution circuit by one of a plurality of second clock distribution circuits based on a result of the timing verification,
    wherein each of the first clock distribution circuit and the plurality of second clock distribution circuits comprises a first inverter circuit that receives an input signal, the first inverter circuit comprising:
    serially-connected N transistors having a first conductive type (N is a natural number equal to or greater than 2); and
    M transistors having a second conductive type (M is a natural number equal to or greater than 1), the M transistors being connected in series with the N transistors having the first conductive type, and
    wherein the first inverter of the first clock distribution circuit is different from the first inverter of all of the plurality of the second clock distribution circuits in a combination of a pair of a transistor having the first conductive type and a transistor having the second conductive type, a control terminal of each of the pair of transistors receiving the input signal,
    wherein a number of the pairs of transistors receiving the input signal in the first clock distribution circuit and a number of the pairs of transistors receiving the input signal in each of the plurality of the second clock distribution circuits is equal.

2. The layout design method according to claim 1, wherein each of the first clock distribution circuit and the plurality of second clock distribution circuits comprises a second inverter circuit that transmits an output signal of each of the first clock distribution circuit and the plurality of second clock distribution circuits.

3. The layout design method according to claim 1, wherein control terminals of the transistors having the first conductive type other than the transistor receiving the input signal are connected to a ground and control terminals of the transistors having the second conductive type other than the transistor receiving the input signal are connected to a power source.

4. The layout design method according to claim 1, further comprising verifying timing of the clock tree circuit in which the replacement to the one of the plurality of second clock distribution circuits was made.

5. The layout design method according to claim 1,
    wherein the first clock distribution circuit has roughly a middle delay value among a plurality of prepared clock distribution circuits.

6. The layout design method according to claim 5, wherein a rising time and a falling time of the first clock distribution circuit are roughly equal.

7. The layout design method according to claim 1, wherein in the replacement, a pulse width calculated from a result of the timing verification is compared with a desired pulse width, and the one of the plurality of second clock distribution circuits is selected based on their difference.

8. The layout design method according to claim 1, wherein transistor sizes of the transistors having the first and second conductive types are determined so that a rising time and a falling time become roughly equal in the combination that provides the roughly middle delay value.

* * * * *